United States Patent [19]

Fillot et al.

[11] Patent Number: 4,654,196
[45] Date of Patent: Mar. 31, 1987

[54] PROCESS FOR PRODUCING A POLYCRYSTALLINE ALLOY

[75] Inventors: Alain Fillot, St. Ismier; Jean Gallet, St. Laurent du Pont; Sylvain Paltrier, Meylan; Bernard Schaub, Grenoble, all of France

[73] Assignee: Commissariat A l'Energie Atomique, Paris, France

[21] Appl. No.: 760,175

[22] Filed: Jul. 29, 1985

[51] Int. Cl.$^4$ ............................ C22C 1/02; C22C 7/00
[52] U.S. Cl. .................................... 420/525; 420/526; 420/590
[58] Field of Search .................. 420/525, 526, 590; 148/128

[56] References Cited

U.S. PATENT DOCUMENTS

| | | | |
|---|---|---|---|
| 3,468,363 | 9/1969 | Parker et al. | 420/590 |
| 3,656,944 | 4/1972 | Brau | 420/590 |
| 3,777,009 | 12/1974 | Menashi et al. | 420/590 |
| 3,849,205 | 11/1985 | Brau et al. | 148/1.6 |
| 4,011,074 | 3/1977 | Dietl et al. | 420/590 |

FOREIGN PATENT DOCUMENTS 2051607  1/1982  United Kingdom .

Primary Examiner—Christopher W. Brody
Attorney, Agent, or Firm—Oblon, Fisher, Spivak, McClelland & Maier

[57] ABSTRACT

Process for the preparation of a polycrystalline alloy for producing monocrystals by passage in a solvent zone.

The compound is completely melted by heating it to a temperature above its melting point and for a time sufficient for the homogenization of the liquid. This is followed by a cooling of the liquid by bringing it to a temperature below the melting point thereof. The sudden rise of the temperature occurring at the end of the superfusion of the liquid is monitored and the mixture then undergoes sudden tempering bringing about the instantaneous solidification of the entity in the form of a homogeneous polycrystalline ingot.

7 Claims, 1 Drawing Figure

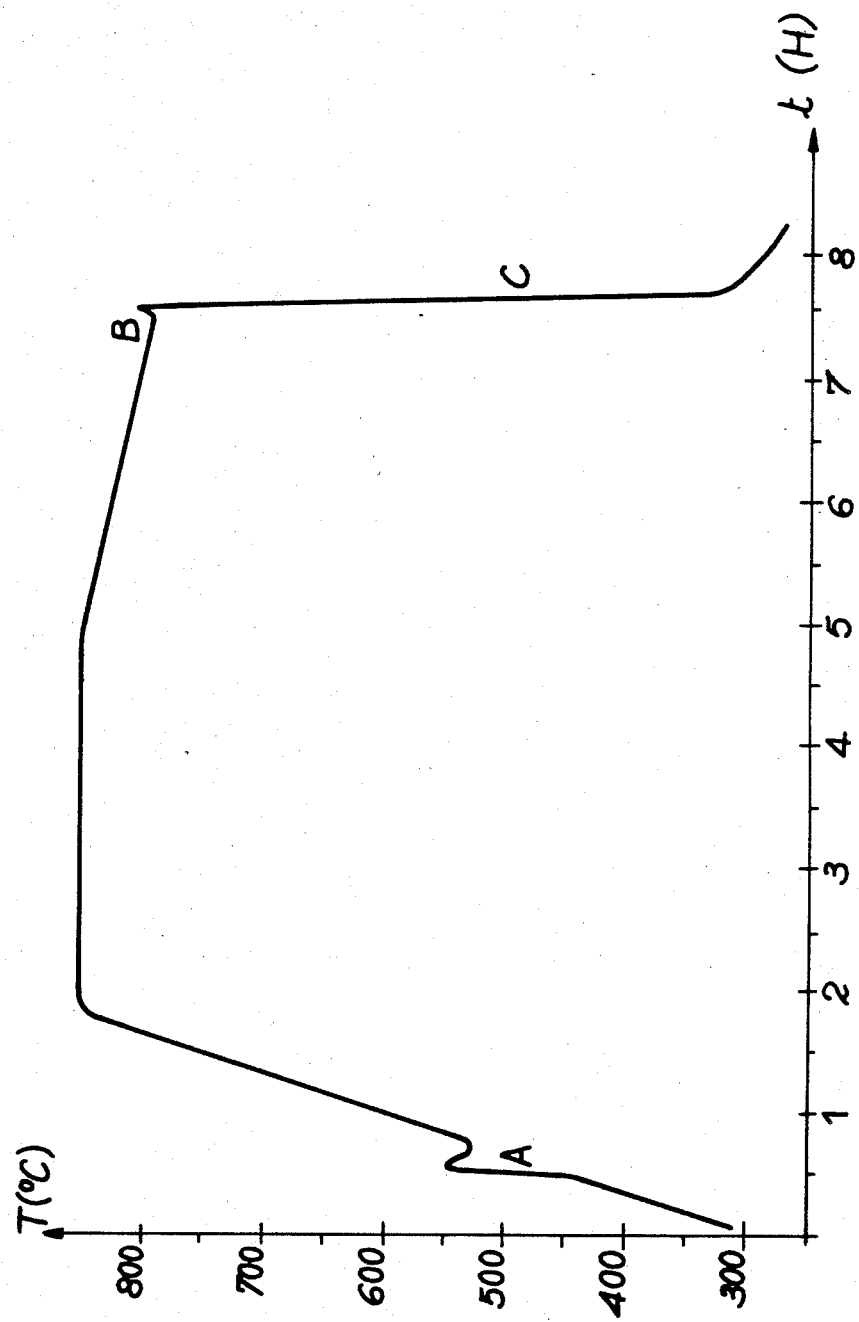

PROCESS FOR PRODUCING A POLYCRYSTALLINE ALLOY

BACKGROUND OF THE INVENTION

The present invention relates to the production of a ternary or quaternary polycrystalline alloy to be used in the production of semiconductor compounds by passage in per se known manner into a solvent zone. More specifically, the invention relates to the production of a "source" alloy, which is intended, through passing into the solvent zone, to produce crystals of semiconductor compounds, which are either ternary of type $Cd_x Hg_{0.5-x} Te_{0.5}$, or quaternary of type $Cd_x Hg_{0.5-x} Te_y Se_{0.5-y}$, in which $0 < x < 0.5$ and $0 < y < 0.5$. These compounds have a forbidden band width varying continuously with the atomic fractions x and y, which consequently permits the production of infrared photo conductors at any wavelength above 0.8 micrometre.

From a general standpoint, the use of a solvent makes it possible to produce such semiconductor compounds at a temperature below their melting temperature, so that it is possible to obtain purer materials with a better crystalline quality. More specifically, the use of a solvent in the case of semiconductor compounds $Cd_x Hg_{0.5-x} Te_{0.5}$ and $Cd_x Hg_{0.5-x} Te_y Se_{0.5-y}$ makes it possible to overcome the difficulties linked with the fact that mercury vapour has a high pressure at the melting temperature of such compounds.

The general principle of the method for forming a monocrystal by solvent transfer consists of making an ingot of a solid semiconductor compound passed longituninally through a molten zone of said solvent. This method is widely known and forms the subject matter of French Patents Nos. EN 74 42 769 of 24/12/1974 and EN 82 20 053 of 30/11/1982 filed in the name of the COMMISSARIAT A L'ENERGIE ATOMIQUE.

French Patent No. EN 74 42 769 describes the use of juxtaposed alloy bars as the materials constituting the supply "source" of the solvent zone for the growth of types II-VI semiconductor compounds. French Patent No. EN 81 05 387 of the Société Anonyme de Telecommunications associates the operation of juxtaposing CdTe and HgTe bars with the use of an initial solvent zone constituted by a tellurium rich CdHgTe mixture. In this case, the use of a HgTe bar implies a limitation of the temperature of the solvent zone, which must not exceed 760° C., which is the melting temperature of the alloy HgTe.

French Patent No. EN 82 20 053 proposes a method in which the supply material of "source" of the solvent zone is a compacted, interdiffused, homogeneous mixture of CdTe and HgTe mixture. This makes it possible to avoid the difficult machining of alloy bars, which is otherwise necessary for obtaining the desired exact proportions and makes it possible to overcome the preferential solubility of HgTe in the solvent. This method also makes it possible to carry out the transfer through the solvent zone at temperatures above 670° C., but the residual porosity of the source material continues to be a handicap for producing long crystals.

In general terms, it can be seen that the various prior art processes lead to significant problems in connection with the preparation of ternary or quaternary crystals $Cd_x Hg_{0.5-x} Te_{0.5}$ or $Cd_x Hg_{0.5-x} Te_y Se_{0.5-y}$ when using the method of transferring a source alloy into a solvent zone. Thus, the preparation of a source alloy with a very considerable composition homogeneity and which is free from porosity is relatively difficult.

Ternary or quaternary alloys have already been produced by heating the compounds to the melting point in an ampoule sealed by a plug which may or may not be extended by a capillary tube, said ampoule being placed in an enclosure making it possible to raise the alloy temperature during formation, by placing said enclosure in an electric furnace and by maintaining in its interior, i.e. around the ampoule, a high pressure of a neutral or reducing gas, so as to compensate the pressure of the mercury vapour in equilibrium with the liquid to prevent it from escaping from the ampoule, or to ensure that the thin walls of the latter are not subject to a significant pressure difference between the inside and the outside.

These methods have been described in various articles by J. STEININGER, e.g. in Journal of Crystal Growth, vol. 37, pp 107-115, 1977 and by A. W. VERE et al, Journal of Crystal Growth, vol. 59, pp 121-129, 1982, but they lead to ingots having an inadequate homogeneity for the growth of a crystal by solvent zone passage.

SUMMARY OF THE INVENTION

The present invention relates to a process for the preparation of a polycrystalline source alloy not suffering from the aforementioned prior art disadvantages, but whilst being just as easily realizable as the prior art processes.

The present invention therefore specifically relates to a process for the preparation of a ternary or quaternary polycrystalline alloy for producing monocrystals by passing in per se known manner into a solvent zone, the components of the alloy being placed in a desired proportion in a thin-walled ampoule placed in an enclosure filled with a gas at high pressure and equipped with fast heating and cooling means, wherein means for measuring the temperature are positioned in the vicinity of the components to be treated, the compound of desired composition is completely melted by heating to a temperature above its melting point and for a time sufficient for the homogenization of the liquid, followed by a progressive, isothermic cooling of said liquid by bringing it to a temperature below its melting point and monitoring, with the aid of a temperature measuring means, the sudden rise thereof indicating the end of the superfusion of the liquid, followed by a sudden tempering of the mixture bringing about the instantaneous solidification in the form of a homogenous polycrystalline ingot.

Heating for at least one hour is sufficient for bringing about a very good homogenization of the liquid and the slow, controlled lowering of the temperature makes it possible to ensure the isothermic cooling of the liquid until the superfusion state is obtained. It is well known that this superfusion phenomenon has a random nature, i.e. for the same liquid and for identical conditions, the sudden solidification can occur at widely differing temperatures between individual experiments. Thus, in the process according to the invention, the heat sensor can be placed against the ampoule and is generally a thermocouple and monitors the appearance of a sudden temperature rise indicating the change of state as a result of the start of solidification, so that it is possible to start tempering by rapid cooling at the final instant at rich liquid superfusion stops. Crystallization is then instantaneous at any point of the medium and occurs in a temperature-uniform form, so that a polycrystalline ingot with very considerable homogeneity is obtained. Under these conditions of process performance, the inevitable physical process of cadmium and mercury segregation only occurs at a very short distance.

According to a secondary feature of the process according to the invention, the complete melting of the compound takes place at a temperature approximately 50° higher than its melting point and the subsequent progressive cooling takes place at a rate close to 20° C. per hour.

According to another feature of the process according to the invention, the sudden tempering of the ampoule is brought about, following the stopping of the enclosure heating means, by a circulation of a cold gas around the ampoule. Preferably use is made of a neutral gas, such a helium, nitrogen, argon, preference being given to helium. It is also possible to use a reducing gas, such as e.g. pure hydrogen.

The tempering operation with the aid of a cold gas around the ampoule is greatly aided by the limited thickness of the ampoule walls, which are generally made from silica and which under these conditions are no longer an obstacle to large, rapid heat exchanges.

The performance of the process according to the invention consequently makes it possible to obtain a polycrystalline quaternary or ternary compound ingot, particularly of formula $Cd_x Hg_{0.5-x} Te_{0.5}$ or $Cd_x Hg_{0.5-x} Te_y Se_{0.5-y}$ of considerable composition uniformity and without porosity. Thus, it is suitable for traversing by a solvent zone for producing a monocrystal, e.g. of semiconductor material.

DESCRIPTION OF THE DRAWING AND PREFERRED EMBODIMENTS

The invention will be better understood from the following description of a non-limitative embodiment with reference to the attached graph of FIG. 1 showing the temperature evolution during the phases of the process.

In the hereinafter described embodiment of the invention, a quaternary or ternary liquid alloy of formula $Cd_x Hg_{0.5-x} Te_{0.5}$ or $Cd_x Hg_{0.5-x} Te_y Se_{0.5-y}$ is prepared having the desired composition, it being understood that the flexibility of the process makes it possible to produce any predetermined composition.

Firstly, the components are placed in a thin-walled ampoule, e.g. of silica and these can either be in the form of compounds CdTe, HgTe, CdTeSe, etc. or in the form of the individual elements, such as Cd, Hg, Te, Se.

The ampoule is then sealed with the aid of a plug extended by an open capillary tube and the entity is placed in a container surrounded by a furnace making it possible to raise the temperature of the charge to beyond the total melting point of the ternary or quaternary compound which it is wished to obtain. This enclosure is also designed so as to maintain a high neutral or reducing gas pressure around the ampoule. This makes it possible to ensure that the mercury vapour in equilibrium with the liquid at the time of heating does not escape from the ampoule and also that the thin walls of the latter are not subject to a significant pressure difference between the inside and outside of the ampoule. The neutral or reducing gas pressure does not have to be accurately determined, but must be merely above the mercury vapour pressure in thermodynamic equilibrium with the liquid. This vapour pressure, which differs for each composition of the liquid, is well known from the existing literature (R. F. BEBRICK, Journal of Vacuum Science Technology, 21, 1, May/June 1982).

According to the process of the invention, a heat sensor, generally formed by a thermocouple, is placed against the ampoule and makes it possible to follow the evolution of the temperature of the liquid contained therein. This temperature is fixed at a value above the total melting point $T_F$ of the liquid phase, e.g. 50° C. above the same. The total melting point of the compounds, which differs as a function of each composition, is also known from the literature (F.R. SFOFAN and S.L. LEHOCKZY, Journal of Electronic Material, vol. i0, No. 6, 1981).

Following the few hours necessary for the homogenization of the liquid, the ampoule temperature is progressively lowered, e.g. at a rate of 20° C. per hour. This temperature drop speed does not have to be accurately determined, the only condition to be fulfilled being that it ensures an isothermic cooling of the liquid. This phase of the process consequently makes it possible to bring the homogeneous liquid mixture to a temperature below the solidification start temperature, i.e. it brings about the superfusion phenomenon. Using the heat sensor placed against the ampoule, the sudden rise of said temperature characterizing the appearance of calories produced by the start of solidification is monitored. As from this time, rapid cooling or tempering of the ampoule takes place at the final instant of the superfusion of the liquid. In this way, the temperature-uniform liquid instantaneously crystallizes at all points at the same time, whilst the inevitable cadmium and mercury segregation only takes place over a very short distance. Tempering is carried out with the aid of conventional metallurgical means, namely the cutting out of the electric power supply of the heating furnace and the simultaneous injection of cold gas around the ampoule, whereby said gas can in particular be helium, which has a high thermal conductivity. The tempering operation is greatly aided by the limited thickness of the ampoule walls, which are consequently no longer an obstacle to heat exchanges between the liquid phase during crystallization and the outside.

The realization of the process described in general terms hereinbefore has made it possible to produce ingots of ternary compound of type $Cd_x Hg_{0.5-x} Te_{0.5}$ or quaternary compounds of type $Cd_x Hg_{0.5-x} Te_y Se_{0.5-y}$ with (x, y<0.5) in polycrystalline form and having a high composition homogeneity or uniformity, whilst being free from any porosity. These compounds are perfectly suitable for being subsequently treated through a solvent zone for carrying out the preparation of monocrystals of semiconductor compounds more particularly usable as infrared detectors.

With reference to FIG. 1, a description will now be given of a specific example of producing a polycrystalline alloy ingot. This example illustrates the performance of the process for poducing a ternary ingot having composition $Cd_{0.11} Hg_{0.39} Te_{0.5}$.

24.69 g of Cd, !27.40 g of Te and i56.3i g of Hg, all in high purity form, are introduced into a thin-walled, silica ampoule having an internal diameter of 24 mm and an external diameter of 28 mm. The ampoule is sealed by a silica plug, extended by a capillary tube having an internal diameter of 5 mm and an approximate length of 200 mm. A thermocouple is fixed to the outer wall of the ampoule, which is placed in the isothermic zone of a high pressure furnace. The furnace enclosure is then discharged and filled several times with high purity helium and is finally pressurized with this gas to 50 atmospheres.

The temperature is then raised to 850° C. in approximately two hours the theoretical total melting point of the mixture being 804° C.

The pressure is then adjusted to approximately 70 atmospheres. The recording of the thermocouple signal, shown in FIG. 1, makes it possible to note in region A the temperature rise to 450° C., due to the calories produced by the reaction of the components.

After three hours at 850° C., the temperature is lowered at a rate of approximately 20° C. per hour, the ampoule being isothermic. At 791° C., namely an ultimate superfusion of 13° C., the recording shows (region B in FIG. 1) a sudden temperature rise linked with the calories produced, at all points of the liquid, due to the start of crystallization. The electric supply of the furnace is then immediately cut off, whilst around the ampoule is circulated a cold helium stream at 30 m$^3$/h, the pressure in the enclosure being maintained (FIG. 1, region C).

Following complete cooling, the enclosure is brought to atmospheric pressure, the ampoule is opened by sawing and gives a polycrystalline ingot with fine grains of a few mm$^3$, without porosity and having a homogeneous atomic composition $Cd_{0.11} Hg_{0.39} Te_{0.5}$, which is suitable for the crystallization of a semiconductor monocrystal of the same composition by solvent zone passage.

What is claimed is:

1. A process for the preparation of a homogeneous ternary or quaternary polycrystalline alloy for producing semiconductor compounds by passage into a solvent zone, comprising:

placing the components of said alloy in the desired proportions in a thin-walled ampoule placed in an enclosure filled with a gas at high pressure and equipped with fast heating and cooling means;

heating the ampoule to a temperature above the melting point of said alloy compound for a time sufficient to homogenize the liquid, with the temperature being monitored by temperature measuring means positioned in the vicinity of the components being heated;

slowly lowering the temperature of the liquid so that superfusion of the alloy melt occurs;

continuously monitoring the temperature; and when a sudden increase of temperature occurs indicating the end of superfusion, quickly cooling the liquid, thereby bringing about the instantaneous solidification of the melt in the form of a homogeneous polycrystalline ingot.

2. The process according to claim 1, wherein the temperature of the molten alloy is raised to a temperature approximately 50° C. higher than its melting point and wherein the subsequent progressive cooling of said alloy takes place at a rate of about 20° C. per hour.

3. The process according to claim 1, wherein the content of said alloy in the ampoule is heated for at least one hour.

4. The process according to claim 1, wherein the alloy content of said ampoule is suddenly tempered by the quick cooling of said alloy by the circulation of cold gas around the ampoule.

5. The process according to claim 4, wherein said cold gas is a gas selected from the group consisting of helium, argon and nitrogen.

6. The process according to claim 1, wherein a polycrystalline ternary alloy of the formula: $Cd_x Hg_{0.5-x} Te_{0.5}$ or a polycrystalline quaternary alloy of the formula $Cd_x Hg_{0.5-x} Te_y Se_{0.5-y}$, wherein both x and y are less than 0.5, is prepared.

7. The process according to claim 4, wherein the gas is dry hydrogen.

* * * * *